US012713852B2

(12) United States Patent
Oh et al.

(10) Patent No.: US 12,713,852 B2
(45) Date of Patent: Aug. 18, 2026

(54) ETCHING COMPOSITION FOR SELECTIVELY ETCHING SILICON NITRIDE, ETCHING METHOD, AND MANUFACTURING METHOD OF SEMICONDUCTOR DEVICE USING THE SAME

(71) Applicants: SK hynix Inc., Icheon (KR); UIF (University Industry Foundation), Yonsei University, Seoul (KR)

(72) Inventors: Eun Seok Oh, Icheon-si (KR); Young Mee Kang, Icheon-si (KR); Hyun Goo Kang, Icheon-si (KR); Go Un Kim, Icheon-si (KR); Sang Woo Lim, Seoul (KR); Tae Gun Park, Gwacheon-si (KR)

(73) Assignees: SK hynix, Inc., Icheon (KR); UIF (University Industry Foundation), Yonsei University, Seoul (KR)

(*) Notice: Subject to any disclaimer, the term of this patent is extended or adjusted under 35 U.S.C. 154(b) by 320 days.

(21) Appl. No.: 18/335,620

(22) Filed: Jun. 15, 2023

(65) Prior Publication Data

US 2024/0014044 A1 Jan. 11, 2024

(30) Foreign Application Priority Data

Jul. 6, 2022 (KR) ........................ 10-2022-0082915

(51) Int. Cl.
*H10P 50/28* (2026.01)
*H10P 14/40* (2026.01)
(Continued)

(52) U.S. Cl.
CPC .......... *H10P 50/283* (2026.01); *H10P 14/416* (2026.01); *H10P 14/69215* (2026.01); *H10P 14/69433* (2026.01)

(58) Field of Classification Search
None
See application file for complete search history.

(56) References Cited

U.S. PATENT DOCUMENTS

2021/0108140 A1* 4/2021 Kim ........................ C09K 13/08
2021/0115297 A1* 4/2021 Petro ........................ C09G 1/02
(Continued)

FOREIGN PATENT DOCUMENTS

CA 2303183 C * 9/2009 ........... C23C 22/184
JP 2016092392 A 5/2016
(Continued)

*Primary Examiner* — Binh X Tran

(57) ABSTRACT

Disclosed are an etching composition for selectively etching a silicon nitride, an etching method using the same, and a manufacturing method of a semiconductor device. The disclosed etching composition is an etching composition capable of increasing an etching selectivity for a silicon nitride over a silicon oxide and a polycrystalline silicon, and may include an inorganic acid, a solvent, and an additive, and the additive may include one or both of a compound containing an epoxy group and a compound containing a vinyl group. The compound containing the epoxy group may include one or more of glycid, allyl glycidyl ether, epichlorohydrin, 1,2-epoxy-3-phenoxypropane and 2,3-epoxypropyl benzene. The compound containing the vinyl group may include one or both of vinyl bromide and phenyl vinyl ether.

12 Claims, 6 Drawing Sheets

(51) Int. Cl.

| | |
|---|---|
| ***H10P 14/692*** | (2026.01) |
| ***H10P 14/694*** | (2026.01) |

(56) References Cited

U.S. PATENT DOCUMENTS

| | | | | |
|---|---|---|---|---|
| 2022/0051938 | A1* | 2/2022 | Wu | H01L 21/02263 |
| 2022/0081615 | A1* | 3/2022 | Endo | C09K 13/06 |
| 2022/0157613 | A1* | 5/2022 | Ge | H10P 50/283 |

FOREIGN PATENT DOCUMENTS

| | | | |
|---|---|---|---|
| KR | 1020210007574 | A | 1/2021 |
| KR | 1020210046496 | A | 4/2021 |
| KR | 1020210134971 | A | 11/2021 |

* cited by examiner

| | |
|---|---|
| Compound containing an epoxy group (30a) | glycid |
| | allyl glycidyl ether |
| | epichlorohydrin |
| | 1,2-epoxy-3-phenoxypropane |
| | 2,3-epoxypropyl benzene |
| Compound containing an vinyl group (30b) | vinyl bromide |
| | phenyl vinyl ether |

< Comparative Example 1 >

< Comparative Example 2 >

< Embodiment 5 >

ETCHING COMPOSITION FOR SELECTIVELY ETCHING SILICON NITRIDE, ETCHING METHOD, AND MANUFACTURING METHOD OF SEMICONDUCTOR DEVICE USING THE SAME

CROSS-REFERENCE TO RELATED APPLICATION

The present application claims, under 35 U.S.C. § 119(a), the benefit of Korean Patent Application No. 10-2022-0082915, filed on Jul. 6, 2022, which is herein incorporated by reference in its entirety.

BACKGROUND

1. Field

Embodiments of the present disclosure relates to an etching composition, an etching method using the same, and a device manufacturing method, and more particularly, to an etching composition for selectively etching a silicon nitride, an etching method using the same, and a manufacturing method of a semiconductor device.

2. Description of the Related Art

Various insulators (dielectrics), semiconductors, and conductor materials are applied to semiconductor processing. As an insulator material, a silicon oxide, a silicon nitride, a silicon oxynitride, a high dielectric (high-k) material, etc. may be used, and as a semiconductor material, a single crystal silicon, a polycrystalline silicon, an amorphous silicon, a germanium, a silicon-germanium, and various other compound semiconductors may be used.

A silicon oxide film, a silicon nitride film, and a polysilicon film may play various roles in a semiconductor process and may be used in various ways. For example, a silicon oxide film and a silicon nitride film may be used as an insulating film, a sacrificial film, a mold layer, a protective layer and the like, and a polysilicon film may be used as a channel material having a semiconductor property or may be doped to have conductivity and used as a conductive member. For example, in a manufacturing process of a three-dimensional vertical NAND memory semiconductor device, a structure in which a silicon nitride film and a silicon oxide film are alternately and repeatedly stacked may be used, and polycrystalline silicon may be used as a channel material. At this time, a structure in which a silicon nitride film, a silicon oxide film, and a polycrystalline silicon film are adjacent to each other may be formed, and a process for selectively etching and removing the silicon nitride film from this structure may be desirable.

Conventionally, a predetermined acidic solution has been used in the process of etching the silicon nitride film, but in this case, there is a limit to increasing the etching selectivity of the silicon nitride film compared to the polycrystalline silicon or silicon oxide film. As a method for suppressing the etching of the silicon oxide film when etching the silicon nitride film, an etching method using a silicon-based compound as an additive has been proposed. However, since the silicon-based compound does not sufficiently suppress etching of polycrystalline silicon, and an oxide regrowth occurs on the silicon oxide film portion, there are difficulties in performing subsequent processes. In addition, research on a technology for suppressing etching of polycrystalline silicon during etching of a silicon nitride film is lacking.

SUMMARY

A technological object to be achieved by embodiments of the present disclosure is to provide an etching composition capable of increasing an etching selectivity of a silicon nitride compared to a silicon oxide and a polycrystalline silicon.

In addition, a technological object to be achieved by embodiments of the present disclosure is to provide an etching composition capable of increasing an etching selectivity of a silicon nitride with respect to both of a silicon oxide and a polycrystalline silicon when the silicon oxide, the polycrystalline silicon, and the silicon nitride are simultaneously exposed, and substantially suppressing/preventing regrowth of silicon oxide generated by an etching by-product, etc.

In addition, a technological issue to be addressed by embodiments of the present disclosure is to provide an etching method using the etching composition.

In addition, a technological issue to be addressed by embodiments of the present disclosure is to provide a manufacturing method of a semiconductor device (electronic device) to which an etching method using the etching composition is applied.

The objects to be achieved by embodiments of the present disclosure are not limited to the objects mentioned above, and other objects not mentioned will be understood by those skilled in the art from the description below.

According to one embodiment of the present disclosure, there is provided an etching composition capable of increasing an etching selectivity for a silicon nitride over a silicon oxide and a polycrystalline silicon, and comprising: an inorganic acid; solvent; and an additive, wherein the additive includes one or both of a compound containing an epoxy group and a compound containing a vinyl group.

The inorganic acid may be any one selected from a group consisting of phosphoric acid, sulfuric acid, nitric acid, silicic acid, hydrofluoric acid, boric acid, hydrochloric acid, perchloric acid, and a mixture thereof.

The inorganic acid may be, for example, phosphoric acid.

A content of the inorganic acid in a total amount of the inorganic acid and the solvent may be in a range of about 80 to about 90 wt %.

The solvent may include water ($H_2O$).

The compounds containing the epoxy group may include one or more of glycid, allyl glycidyl ether, epichlorohydrin, 1,2-epoxy-3-phenoxypropane and 2,3-epoxypropyl benzene.

The compound containing the vinyl group may include one or both of vinyl bromide and phenyl vinyl ether.

A content of the additive in the etching composition may be in a range of about 0.001 to about 20 wt %.

The etching composition may have an etching selectivity of about 30 or more for the silicon nitride compared to the polycrystalline silicon.

The etching composition may have an etching selectivity of about 30 or more for the silicon nitride compared to the silicon oxide.

According to another embodiment of the present disclosure, there is provided an etching method comprising preparing a substrate structure on which a silicon nitride and at least one of a silicon oxide and a polycrystalline silicon are disposed; and selectively etching the silicon nitride with respect to at least one of the silicon oxide and the polycrystalline silicon by using the above-mentioned etching composition on the substrate structure.

The selectively etching the silicon nitride may be performed at a temperature in a range of about 100 to 200° C.

According to another embodiment of the present disclosure, there is provided a manufacturing method of a semiconductor device comprising: providing a substrate structure on which a silicon nitride and one or both of a silicon oxide and a polycrystalline silicon are disposed; and selectively etching the silicon nitride with respect to at least one of the silicon oxide and the polycrystalline silicon by applying the above-mentioned etching composition to the substrate structure.

The semiconductor device may be, for example, a vertical NAND device.

The manufacturing method of the semiconductor device may include forming a stacked structure in which a plurality of silicon nitride films and a plurality of silicon oxide films are alternately stacked in a specific direction on a substrate; forming a polycrystalline silicon member extending in the specific direction within the stacked structure; and selectively etching the silicon nitride film with respect to the silicon oxide film and the polycrystalline silicon member by using the etching composition.

According to embodiments of the present disclosure, it is possible to implement an etching composition capable of increasing an etching selectivity for a silicon nitride over a silicon oxide and a polycrystalline silicon. In particular, it is possible to implement an etching composition capable of increasing an etching selectivity of a silicon nitride with respect to both of a silicon oxide and a polycrystalline silicon in a structure in which the silicon oxide, the polycrystalline silicon, and the silicon nitride are simultaneously exposed, and also suppressing/preventing regrowth of silicon oxide generated by an etching by-product, etc.

Therefore, the etching composition described above may be effectively used as an etchant when selectively etching a silicon nitride in a structure in which silicon nitride and polycrystalline silicon are exposed, a structure in which silicon nitride and silicon oxide are exposed, or a structure in which silicon nitride, silicon oxide, and polycrystalline silicon are simultaneously exposed.

In addition, since the above etching composition has a property of suppressing the regrowth of silicon oxide, when selectively etching a silicon nitride in a high tier stacked structure, for example, a stacked structure applied to the manufacture of a three-dimensional vertical NAND device, regrowth of silicon oxide may be effectively suppressed. Therefore, a highly integrated/high-performance semiconductor device may be easily manufactured by using the etching composition according to the embodiments.

DETAILED DESCRIPTION

Figures 1, 2:
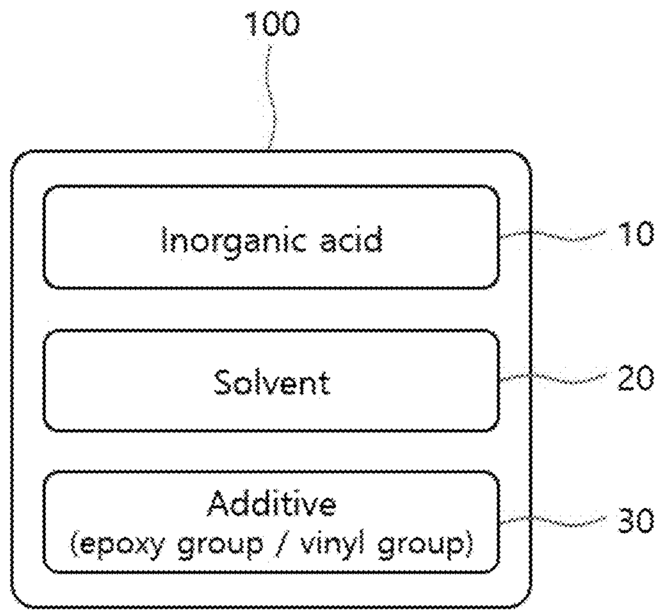
FIG. 1 is a diagram for explaining an etching composition for selectively etching a silicon nitride according to an embodiment of the present disclosure.
FIG. 2 is a diagram illustrating specific materials of additives which may be included in an etching composition according to an embodiment of the present disclosure.

Hereinafter, the embodiments of the present disclosure will be described in detail with reference to the accompanying drawings.

The embodiments of the present disclosure to be described below are provided to more clearly explain various embodiments of the present disclosure to those having common knowledge in the related art, and the scope of embodiments of the present disclosure is not limited by the following embodiments. The following embodiment may be modified in many different forms.

The terminology used herein is used to describe specific embodiments, and is not used to limit the present invention. As used herein, terms in the singular form may include the plural form unless the context clearly dictates otherwise. Also, as used herein, the terms "comprise" and/or "comprising" specifies presence of the stated shape, step, number, action, member, element and/or group thereof; and does not exclude presence or addition of one or more other shapes, steps, numbers, actions, members, elements, and/or groups thereof. In addition, the term "connection" as used herein is a concept that includes not only that certain members are directly connected, but also a concept that other members are further interposed between the members to be indirectly connected.

In addition, in the present specification, when a member is said to be located "on" another member, this includes not only a case in which a member is in contact with another member but also a case in which another member is present between the two members. As used herein, the term "and/or" includes any one and any combination of one or more of those listed items. In addition, as used herein, terms such as "about," "substantially," etc. are used as a range of the numerical value or degree, in consideration of inherent manufacturing and material tolerances, or as a meaning close to the range. Furthermore, accurate or absolute numbers provided to aid the understanding of the present application are used to prevent an infringer from using the disclosed present invention unfairly.

Hereinafter, the embodiments of the present disclosure will be described in detail with reference to the accompanying drawings. The size or the thickness of the regions or the parts illustrated in the accompanying drawings may be slightly exaggerated for clarity and convenience of description. The same reference numerals refer to the same elements throughout the detailed description.

FIG. 1 is a diagram for explaining an etching composition 100 for selectively etching a silicon nitride according to an embodiment of the present disclosure.

Referring to FIG. 1, the etching composition 100 according to an embodiment of the present disclosure may be a composition for etching a silicon nitride capable of increasing an etching selectivity of a silicon nitride ($Si_xN_y$, for example, $Si_3N_4$) compared to a silicon oxide ($SiO_x$, for example, $SiO_2$) and a polycrystalline silicon. In other words, the etching compassion 100 in FIG. 1 has a relatively high selectivity for the silicon nitride over the silicon oxide and polycrystalline silicone. The etching composition 100 may include an inorganic acid 10, a solvent 20, and an additive 30, wherein the additive 30 may include one or both of a compound containing (including) an epoxy group and a compound containing (including) a vinyl group.

The inorganic acid 10 may include any one selected from a group consisting of phosphoric acid, sulfuric acid, nitric acid, silicic acid, hydrofluoric acid, boric acid, hydrochloric acid, perchloric acid, and a mixture thereof. The inorganic acid 10 may be any one of phosphoric acid, sulfuric acid, nitric acid, silicic acid, hydrofluoric acid, boric acid, hydrochloric acid, perchloric acid, and a mixture thereof. For example, the inorganic acid 10 may be a phosphoric acid or may include a phosphoric acid. In this case, the etching composition 100 may be referred to as a phosphoric acid-based etching composition.

The inorganic acid 10 may be used by mixing with a predetermined solvent 20. The solvent 20 may be, for example, water ($H_2O$) or may include water. Here, the water may be deionized water, but may not be deionized water in some cases. A content of the inorganic acid 10 in a total amount of the inorganic acid 10 and the solvent 20 may be in a range of about 80 to about 90 wt %. A content of the solvent 20 in the total amount of the inorganic acid 10 and the solvent 20 may be in a range of about 10 to about 20 wt %. When the content of the inorganic acid 10 in the total amount of the inorganic acid 10 and the solvent 20 is less than about 80 wt %, it may not be easy to raise the temperature (temperature rise) of the etching composition 100. On the other hand, when the content of the inorganic acid 10 in the total amount of the inorganic acid 10 and the solvent 20 is higher than about 90 wt %, it may not be easy to secure excellent processability and etching characteristics. Therefore, the content of the inorganic acid 10 in the total amount of the inorganic acid 10 and the solvent 20 may be about 80 to about 90 wt %.

The epoxy group and/or the vinyl group which may be included in the additive 30 may be a component included in an aliphatic hydrocarbon or an alicyclic hydrocarbon, or may be a component included in an aromatic hydrocarbon. In an etching process using the etching composition 100, the epoxy group (or a compound containing the same) and/or the vinyl group (or a compound containing the same) may be passivated on the surface of polycrystalline silicon and silicon oxide, and may serve to suppress etching of the polycrystalline silicon and silicon oxide as a result of it. The epoxy group (or a compound containing the same) and/or the vinyl group (or a compound containing the same) may be attached to the surface of the polycrystalline silicon and the surface of the silicon oxide, and may play a role to suppress etching caused due to the inorganic acid 10 (i.e., etching of the polycrystalline silicon and the silicon oxide). Accordingly, the etching composition 100 may have a high etch selectivity for a silicon nitride as compared to polycrystalline silicon and silicon oxide. In addition, the additive 30 including the epoxy group and/or the vinyl group may serve to suppress/prevent regrowth of silicon oxide during an etching process.

When a silicon-based compound is used as an additive in a conventional etching composition, the effect to suppress etching of polycrystalline silicon may be insignificant. Therefore, it may be difficult to secure an etching selectivity of silicon nitride as compared to polycrystalline silicon. In addition, when the silicon-based compound is used as an additive, regrowth of silicon oxide (oxide film) due to an etching by-product occurs on or around a silicon oxide surface. Therefore, when manufacturing a semiconductor device, issues such as difficulties in a subsequent process after etching may occur. However, when the additive 30 according to an embodiment of the present disclosure is used, the etching selectivity for silicon nitride over both of a polycrystalline silicon and a silicon oxide may be increased, and the issues in a conventional etching composition such as regrowth of a silicon oxide may be effectively suppressed/prevented during an etching process.

The compound containing the epoxy group which may be included in the additive 30 may include, for example, one or more of glycid, allyl glycidyl ether, epichlorohydrin, 1,2-epoxy-3-phenoxypropane, and 2,3-epoxypropyl benzene. In addition, the compound containing the vinyl group which may be included in the additive 30 may include, for example, one or both of vinyl bromide and phenyl vinyl ether. For example, the additive 30 may be any one selected from glycid, allyl glycidyl ether, epichlorohydrin, 1,2-epoxy-3-phenoxypropane, 2,3-epoxypropyl benzene, vinyl bromide, and phenyl vinyl ether. Here, the glycid may be expressed as glycid, glycide, or glycidol.

A content of the additive 30 in the total (total weight) of the etching composition 100 may be in a range of about 0.001 to about 20 wt %. The content of the additive 30 in the entire etching composition 100 may be, for example, in a range of about 0.01 to about 10 wt %, or in a range of about 0.1 to about 5 wt %. When this condition is satisfied, it may be advantageous to increase the etching selectivity of a silicon nitride relative to silicon oxide and polycrystalline silicon, and may also be advantageous in suppressing regrowth of silicon oxide. After mixing the additive 30 corresponding to about 0.0001 to about 20 M of the etching composition 100 in a mixed solution (chemical solution) of the inorganic acid 10 and the solvent 20, and the etching composition 100 may be prepared by stirring the resultant mixed solution including the inorganic acid 10, the solvent 20, and the additive 30 at room temperature (25° C.) for a predetermined time (e.g., 1-10 minutes).

As a specific example, when the additive 30 is glycid, the glycid may be added in an amount of about 0.1 to about 3 wt %, for example, about 0.5 wt % based on the total weight of the etching composition 100. When the additive 30 is allyl glycidyl ether, the allyl glycidyl ether may be added in an amount of about 0.1 to about 3 wt %, for example, about 0.7 wt % based on the total weight of the etching composition 100. When the additive 30 is epichlorohydrin, epichlorohydrin may be added in an amount of about 0.1 to about 3 wt %, for example, about 0.6 wt % based on the total weight of the etching composition 100. When the additive 30 is 1,2-epoxy-3-phenoxypropane, 1,2-epoxy-3-phenoxypropane may be added in an amount of about 0.1 to about 3 wt %, for example, about 0.9 wt % based on the total weight of the etching composition 100. When the additive 30 is 2,3-epoxypropyl benzene, 2,3-epoxypropyl benzene may be added in an amount of about 0.1 to about 3 wt %, for example, about 0.8 wt % based on the total weight of the etching composition 100. When the additive 30 is vinyl bromide, the vinyl bromide may be added in an amount of about 0.1 to about 3 wt %, for example, about 0.7 wt % based on the total weight of the etching composition 100. When the additive 30 is phenyl vinyl ether, the phenyl vinyl ether may be added in an amount of about 0.1 to about 3 wt %, for example, about 0.8 wt % based on the total weight of the etching composition 100. For example, when the content of the additive 30 is in a range of about 0.1 to about 3 wt %, the etching composition 100 shows an unexpectedly high selectivity for silicon nitride over both of silicon oxide and polycrystalline silicon and suppressing regrowth of silicon oxide over the entire range, compared to when the content of the additive is less than 0.1 wt % or greater than 3 wt %. However, the content ranges of the additive 30 may vary depending on circumstances.

The etching composition 100 may have an etching selectivity of about 30 or more for a silicon nitride as compared to a polycrystalline silicon. For example, the etching composition 100 may have a high etching selectivity of about 50 or more, or about 70 or more for a silicon nitride as compared to a polycrystalline silicon. In addition, the etching composition 100 may have an etching selectivity of about 30 or more for a silicon oxide as compared to a silicon nitride. For example, the etching composition 100 may have a high etching selectivity of about or more, or about 50 or more for a silicon nitride as compared to a silicon oxide.

FIG. 2 is a diagram illustrating specific materials of additives which may be included in an etching composition according to an embodiment of the present disclosure.

Referring to FIG. 2, the additive (30 in FIG. 1) may include one or both of a compound 30*a* containing an epoxy group and a compound 30*b* containing a vinyl group. The compound 30*a* containing the epoxy group may include, for example, one or more of glycid, allyl glycidyl ether, epichlorohydrin, 1,2-epoxy-3-phenoxypro, and 2,3-epoxypropyl benzene. The compound 30*b* containing the vinyl group may include, for example, one or both of vinyl bromide and phenyl vinyl ether. For example, the additive (30 in FIG. 1) may be one or more of glycid, allyl glycidyl ether, epichlorohydrin, 1,2-epoxy-3-phenoxypropane, 2,3-epoxypropyl benzene, vinyl bromide, and phenyl vinyl ether.

An etching method using the etching composition 100 in FIGS. 1 and 2 will be described.

An etching method according to an embodiment of the present disclosure may include providing a substrate structure on which a silicon nitride and one or both of a silicon oxide and a polycrystalline silicon are disposed (formed), and selectively etching the silicon nitride with respect to one or both of the silicon oxide and the polycrystalline silicon by applying the etching composition 100 to the substrate structure. The etching composition 100 may be used as an etchant when selectively etching silicon nitride in a structure in which silicon nitride and polycrystalline silicon are exposed, a structure in which silicon nitride and silicon oxide are exposed, or a structure in which silicon nitride, silicon oxide, and polycrystalline silicon are simultaneously exposed.

The selectively etching the silicon nitride may be performed in a temperature range of about 100 to about 200° C. An etching process may be performed at a temperature of about 100 to about 200° C. for several minutes to several hours by dipping (i.e., immersing) the substrate structure in an etching reactor equipped with the etching composition 100. As a specific example, the etching process may be performed at a temperature of about 160° C. for about 10 to 60 minutes. When performing the etching process in the above temperature range, it may be advantageous to secure better etching characteristics.

The etching method using the etching composition 100 may be applied to various methods of manufacturing semiconductor devices (electronic devices). A manufacturing method of a semiconductor device according to an embodiment of the present disclosure may include the above-described etching method. Here, the semiconductor device may be, for example, a vertical NAND device (i.e., 3D vertical NAND device). Hereinafter, a manufacturing method of a vertical NAND device according to an embodiment of the present disclosure will be described with reference to FIGS. 3A to 3D and FIG. 4.

FIG. 3A to FIG. 3D are perspective views illustrating an etching method using an etching composition according to an embodiment of the present disclosure and a method for manufacturing a semiconductor device using the same. Here, the semiconductor device may be a vertical NAND device.

Figure 3A:
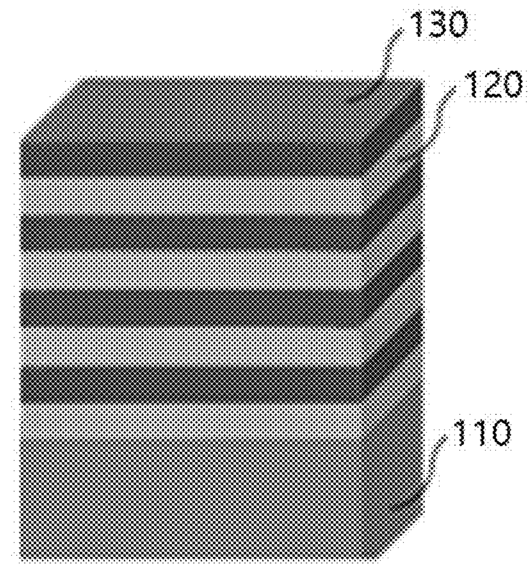
FIG. 3A to FIG. 3D are perspective views illustrating an etching method using an etching composition according to an embodiment of the present disclosure and a method for manufacturing a semiconductor device using the same.

Referring to FIG. 3A, a stack structure in which a silicon nitride film 120 and a silicon oxide film 130 are alternately and repeatedly stacked may be formed on a substrate 110. For example, the stack structure includes a plurality of silicon nitride films 120 and a plurality of silicon oxide films 130 that are alternately stacked in a specific direction (e.g., the vertical direction in FIG. 3A) on a substrate 110. Here, the substrate 110 may be a semiconductor substrate, for example, may be a silicon substrate. The silicon nitride film 120 may be a $Si_xN_y$ film, for example, a $Si_3N_4$ film. The silicon oxide film 130 may be a $SiO_x$ film, for example, a $SiO_2$ film.

Figure 3B:
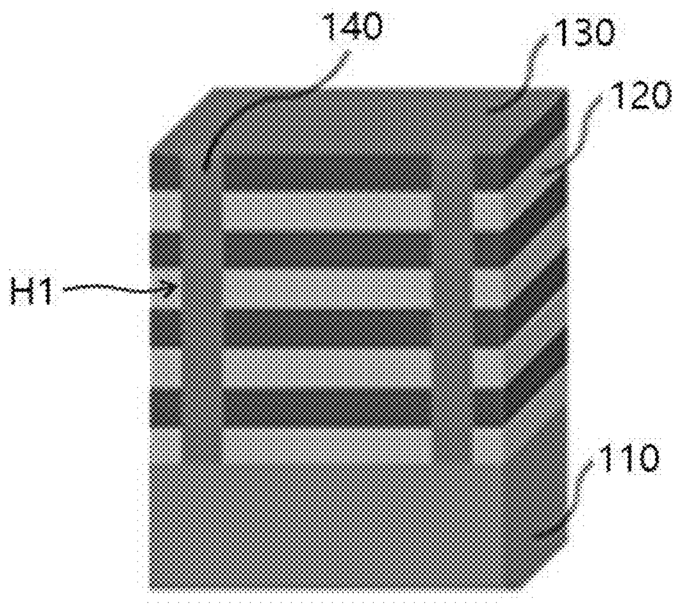

Referring to FIG. 3B, a polycrystalline silicon member 140 extending in a vertical direction may be formed in the stacked structure in which the silicon nitride film 120 and the silicon oxide film 130 are alternately and repeatedly stacked. For example, a vertical hole H1 may be formed in the stacked structure, and the polycrystalline silicon member 140 may be formed to at least partially fill the hole H1. The polycrystalline silicon member 140 may be a kind of plug member. The polycrystalline silicon member 140 may have a solid cylinder structure, but in other cases may have a pipe structure having a hollow portion, and in this case, a predetermined insulating material may be filled in the hollow portion. The polycrystalline silicon member 140 may be formed to contact the substrate 110.

Figure 3C:
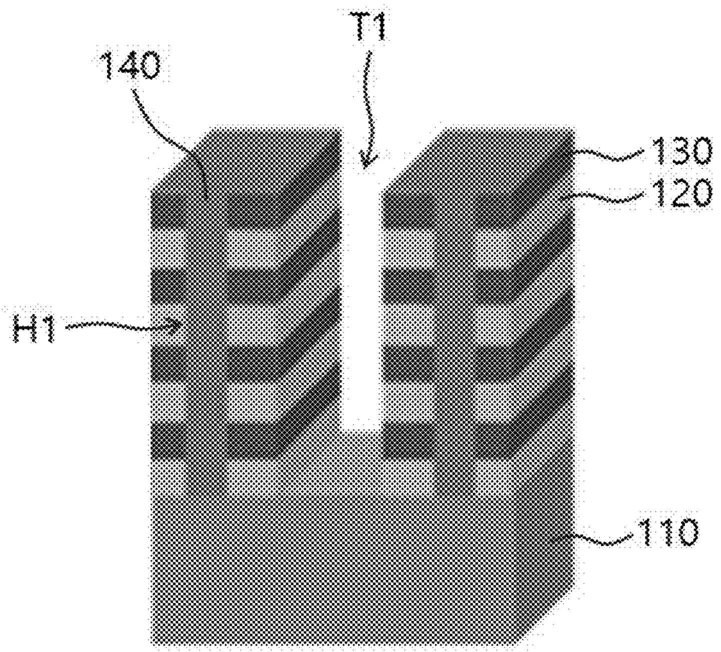

Referring to FIG. 3C, an opening T1 may be formed by removing a portion of the stacked structure in which the silicon nitride film 120 and the silicon oxide film 130 are alternately and repeatedly stacked. The opening T1 may have a trench structure in which an upper surface of the substrate 110 is exposed. The opening T1 may be formed between two adjacent polycrystalline silicon members 140 and spaced apart from them.

Figure 3D:
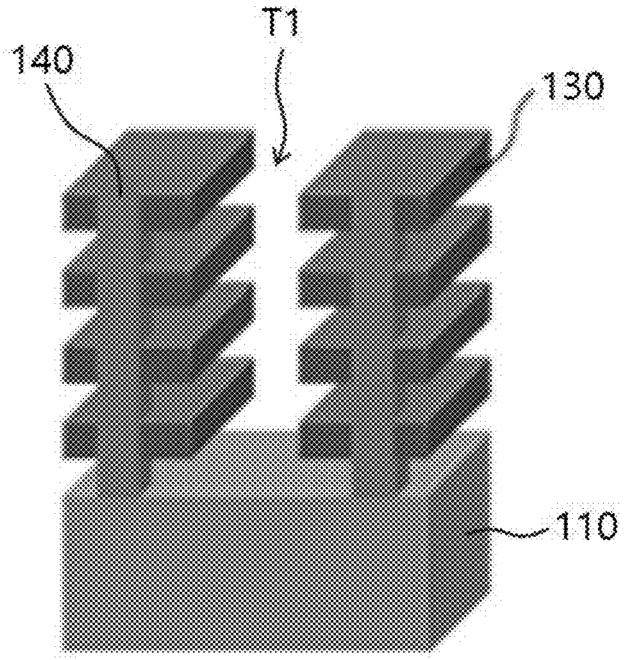

Referring to FIG. 3D, the silicon nitride film (120 in FIG. 3C) may be selectively etched and removed as compared to the silicon oxide film 130 and the polycrystalline silicon member 140 by using the etching composition according to an embodiment of the present disclosure. The etching composition may be penetrated to contact the silicon nitride film (120 in FIG. 3C) through an area of the opening T1 and a surrounding area thereof. In this step, the etching composition 100 described with reference to FIGS. 1 and 2 may be used. When using the etching composition 100, it is possible to increase the etching selectivity of the silicon nitride film (120 in FIG. 3C) as compared to the silicon oxide film 130 and the polycrystalline silicon member 140, and it is also possible to effectively suppressed regrowth of silicon oxide (oxide film) during the etching process.

Figure 4:
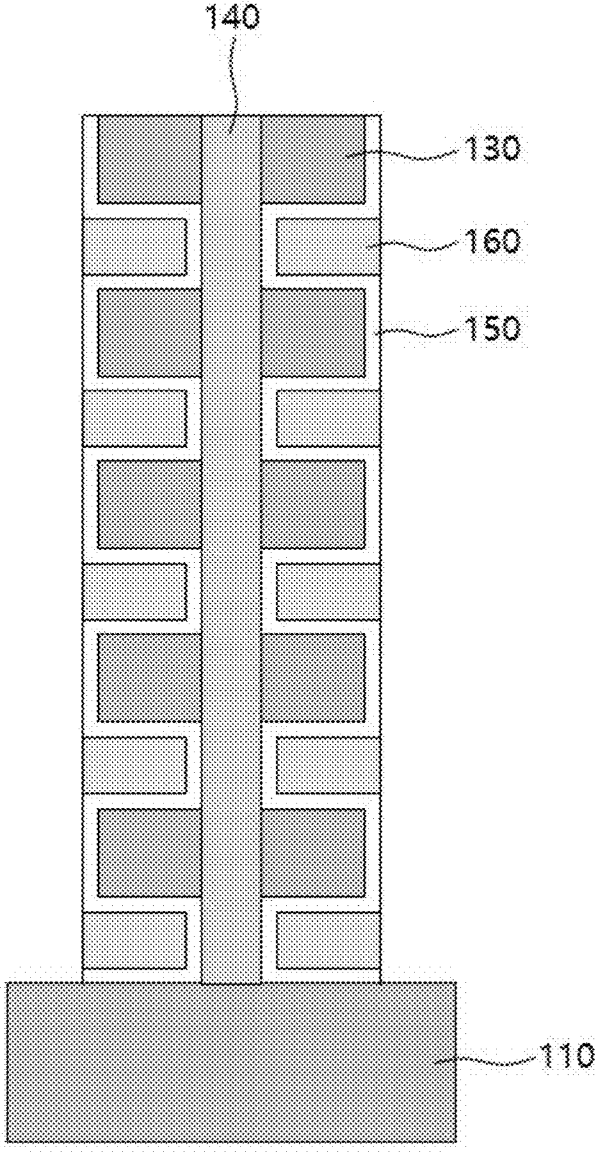
FIG. 4 is a cross-sectional view illustrating a semiconductor device (vertical NAND device) which may be manufactured from the structure of FIG. 3D.

FIG. 4 is a cross-sectional view illustrating a semiconductor device (i.e., vertical NAND device) which may be manufactured from the structure of FIG. 3D. In other words, FIG. 4 is a cross-sectional view illustratively showing a semiconductor device manufactured through a manufacturing method using an etching method which uses an etching composition according to an embodiment of the present disclosure.

Referring to FIG. 4, after the step of FIG. 3D, a dielectric layer 150 having a substantially conformal shape may be formed on surfaces of the polycrystalline silicon member 140 and the plurality of silicon oxide films 130. In addition, a plurality of gate electrodes 160 filling spaces between the plurality of silicon oxide films 130 may be formed. The plurality of gate electrodes 160 may be disposed to face the polycrystalline silicon member 140, and the dielectric layer 150 may be disposed between the plurality of gate electrodes 160 and the polycrystalline silicon member 140. The dielectric layer 150 may include, for example, a tunnel insulating layer, a charge trap layer, and a blocking insulating layer. The tunnel insulating layer may be disposed in contact with the polycrystalline silicon member 140, the blocking insulating layer may be disposed in contact with the gate electrode 160, and the charge trap layer may be disposed between the tunnel insulating layer and the blocking insulating layer. The polycrystalline silicon member 140 may be used as a channel. However, the specific structure of the semiconductor device described with reference to FIG. 4 is an example and may be modified in various ways.

Hereinafter, experimental methods and evaluation methods according to specific embodiments of the present disclosure and comparative examples will be described.

In order to evaluate the etching performance of an etching composition which selectively etches silicon nitride as compared to silicon oxide and polycrystalline silicon, a silicon nitride film and a polycrystalline silicon and a silicon oxide film were deposited on a blanket silicon wafer according to a low pressure chemical vapor deposition (LPCVD) method, respectively. In the case of polycrystalline silicon, polycrystalline silicon doped with phosphorus was used to reflect the actual process. In addition, a stacked structure having a silicon oxide film and a silicon nitride film as a unit layer was manufactured. A specific structure of a wafer including the stacked structure may be substantially the same as described with reference to FIGS. 3A to 3D, for example.

The etching composition according to an embodiment of the present disclosure and the wafer on which the material films were formed were put in a predetermined etching reactor, and an etching process was performed at a temperature of about 160° C. for about 10 to 60 minutes. The etched wafer was washed with deionized water and then dried by using nitrogen gas.

After conducting the etching experiment, the thicknesses of the silicon nitride film, the polycrystalline silicon, and the silicon oxide film on the blanket wafer were measured by using an ellipsometer (model name: MG-1000, manufacturer: Nano-View), and the etching speed was calculated through the difference in thickness before and after the experiment. In addition, a field emission scanning electron microscope (FE-SEM) (model name: JEOL-7610-Plus, manufacturer: JEOL Ltd.) was used to evaluate the state after the etching process of the wafer with the stacked structure, and the thickness of the silicon nitride film etched in the horizontal direction and the thickness of the remaining silicon oxide film were measured.

After preparing a mixed solution (chemical solution) of phosphoric acid of 85 wt % ($H_2O$ of 15 wt %), and mixing each component listed in Table 1 below into the mixed solution based on the total weight of the etching composition, the mixture was stirred at room temperature (about 25° C.) at a rate of about 500 rpm for about 5 minutes to prepare respective etching composition. In Embodiments 1 to 7 and Comparative Example 2, the concentration of the additive may correspond to 0.1 M of the etching composition. In Embodiments 1 to 7 and Comparative Example 2, each additive was added to a phosphoric acid solution of 85 wt %, and in Comparative Example 1, no additive was used.

TABLE 1

| Remark | Type and content of additive (Additive added to 85 weight % phosphoric acid solution) |
|---|---|
| Embodiment 1 | glycid (0.5 wt %) |
| Embodiment 2 | allyl glycidyl ether (0.7 wt %) |
| Embodiment 3 | epichlorohydrin (0.6 wt %) |
| Embodiment 4 | 1,2-epoxy-3-phenoxypropane (0.9 wt %) |
| Embodiment 5 | 2,3-epoxypropyl benzene (0.8 wt %) |
| Embodiment 6 | vinyl bromide (0.7 wt %) |
| Embodiment 7 | phenyl vinyl ether (0.8 wt %) |
| Comparative Example 1 | 85 wt % phosphoric acid without additive |
| Comparative Example 2 | silicic acid (0.6 wt %) |

<Etching Evaluation (1)>

A blanket silicon nitride film wafer, a blanket polycrystalline silicon wafer, and a blanket silicon oxide film wafer were manufactured, respectively. The blanket silicon nitride film wafer may be prepared by forming a silicon nitride film on a blanket wafer. The blanket polycrystalline silicon wafer may be prepared by forming polycrystalline silicon on a blanket wafer. The blanket silicon oxide film wafer may be prepared by forming a silicon oxide film on a blanket wafer. Etching evaluation was performed at a temperature of about 160° C. and atmospheric pressure by using each prepared etching composition and each wafer. The evaluation results for the silicon nitride film (silicon nitride), the polycrystalline silicon, and the silicon oxide film (silicon oxide) are summarized in Table 2 below.

TABLE 2

| Remark | An etching rate of a silicon nitride (Å/min) | An etching rate of a silicon oxide (Å/min) | An etching rate of a polycrystalline silicon (Å/min) | Etching selectivity of a silicon nitride compared to a silicon oxide ($ER_{Si3N4}/ER_{SiO2}$) | Etching selectivity of a silicon nitride compared to a polycrystalline silicon ($ER_{Si3N4}/ER_{poly-Si}$) |
|---|---|---|---|---|---|
| Embodiment 1 | 128 | 2.6 | 1.8 | 49 | 74 |
| Embodiment 2 | 127 | 3 | 3.7 | 42 | 34 |
| Embodiment 3 | 122 | 3.8 | 2.1 | 32 | 57 |
| Embodiment 4 | 128 | 3.7 | 2.2 | 35 | 59 |
| Embodiment 5 | 122 | 2 | 0.5 | 61 | 243 |
| Embodiment 6 | 120 | 3.8 | 0.4 | 32 | 300 |
| Embodiment 7 | 128 | 3.7 | 1.5 | 35 | 86 |

TABLE 2-continued

| Remark | An etching rate of a silicon nitride (Å/min) | An etching rate of a silicon oxide (Å/min) | An etching rate of a polycrystalline silicon (Å/min) | Etching selectivity of a silicon nitride compared to a silicon oxide ($ER_{Si3N4}/ER_{SiO2}$) | Etching selectivity of a silicon nitride compared to a polycrystalline silicon ($ER_{Si3N4}/ER_{poly\text{-}Si}$) |
|---|---|---|---|---|---|
| Comparative Example 1 | 126 | 3.6 | 10.4 | 35 | 12 |
| Comparative Example 2 | 120 | 1.2 | 8.2 | 100 | 15 |

In Table 2, the etching selectivity of a silicon nitride compared to a silicon oxide may be denoted by $ER_{Si3N4}/ER_{SiO2}$, where $ER_{Si3N4}$ represents an etching rate of a silicon nitride and $ER_{SiO2}$ represents the etching rate of a silicon oxide. In addition, in Table 2, the etching selectivity of a silicon nitride compared to a polycrystalline silicon may be denoted by $ER_{Si3N4}/ER_{poly\text{-}Si}$, where $ER_{Si3N4}$ represents an etching rate of a silicon nitride and $ER_{poly\text{-}Si}$ represents an etching rate of a polycrystalline silicon.

As shown in Table 2, etching compositions according to embodiments of the present disclosure may realize an etching rate of 120 Å/min or more for a silicon nitride film. In particular, when using the etching compositions according to embodiments of the present disclosure, it is possible to stably implement a high etching selectivity for the silicon nitride film as compared to the polycrystalline silicon. Specifically, in the case of Embodiments 1 to 7, the etching selectivity of the silicon nitride film compared to the polycrystalline silicon of the etching composition according to the embodiments of the present invention was increased by about 3 times to 25 times as compared to the etching selectivity of Comparative Example 1 using only the phosphoric acid solution. When the silicon-based additive was used in Comparative Example 2, the etching selectivity of the silicon nitride film compared to the polycrystalline silicon was similar to that of Comparative Example 1. As in the embodiments of the present disclosure, when an additive containing an epoxy group or a vinyl group is added to the phosphoric acid solution, the etching rate of the silicon nitride film similar to that of Comparative Example 1 (case using only the phosphoric acid solution) was obtained, and it was possible to secure a significantly increased etching selectivity of silicon nitride film as compared to polycrystalline silicon. Accordingly, etching compositions (ex. Examples 1 to 7) according to embodiments of the present disclosure, each of which includes an additive including an epoxy group, or a vinyl group, or both, have an unexpectedly and significantly increased etching selectivity of silicon nitride film over polycrystalline silicon, compared to conventional etching compositions (e.g., Comparative Examples 1 and 2), while keeping their etching rates similar to those of the conventional etching compositions.

In addition, when using the etching compositions according to embodiments of the present disclosure, the etching selectivity of the silicon nitride film compared to the silicon oxide film in Embodiments 1 to 7 was similar to or increased by up to about 70% as compared to Comparative Example 1 in which only the phosphoric acid solution was used. In addition, the etching compositions according to embodiments of the present disclosure each have beneficial aspects in that the etching selectivity of the silicon nitride film compared to both of the silicon oxide film and the polycrystalline silicon film may be simultaneously improved by having a significantly increased selectivity for the silicon nitride film over the polycrystalline silicon film and a sufficiently high selectivity for the silicon nitride film over the silicon oxide film, compared to Comparative Example 2.

In particular, in the case of Embodiment 5, as the etch selectivity of silicon nitride as compared to silicon oxide is 61, and the etch selectivity of silicon nitride as compared to polycrystalline silicon is 243, and it may be confirmed that the etching selectivity of silicon nitride may be greatly improved for both of the materials (silicon oxide and polycrystalline silicon).

<Etching Evaluation (2)>

In order to evaluate the performance of the etching composition in the 3D vertical NAND structure, a structure in which a silicon nitride film and a silicon oxide film are repeatedly stacked on a silicon wafer was used. The silicon nitride film and the silicon oxide film were alternately deposited more than 100 times, and a trench pattern structure having a high aspect ratio was formed through dry etching. An etching evaluation was performed under conditions of a temperature of about 160° C. and atmospheric pressure by using each of the prepared etching compositions and the wafer provided with the stacked structure. A field emission scanning electron microscope (FE-SEM) (model name: JEOL-7610-Plus, manufacturer: JEOL Ltd.) was used to evaluate the etching rate of the silicon nitride film and oxide regrowth, and the evaluation results were shown in Table 3 below. In Table 3, the degree of suppression of regrowth of silicon oxide on the pattern is a value obtained by dividing the depth of the starting layer in which regrowth of a silicon oxide (oxide film) occurs by the depth of the entire pattern (i.e., the depth of the trench pattern) in the repeated stacked structure of silicon oxide and silicon nitride, and what the value is getting smaller indicates that the regrowth of the oxide (oxide film) has occurred from an upper layer portion. That is, it may be said that as this value is getting smaller, regrowth of silicon oxide occurs more easily, and as this value is getting larger, regrowth of silicon oxide is suppressed.

TABLE 3

| Remark | An etching rate of a silicon nitride (Å/min) | Suppressing degree of regrowth of a silicon oxide (A regrowth starting depth of a silicon oxide/a depth of entire pattern) |
|---|---|---|
| Embodiment 1 | 108 | 0.54 |
| Embodiment 2 | 100 | 0.50 |
| Embodiment 3 | 108 | 0.55 |
| Embodiment 4 | 104 | 0.55 |
| Embodiment 5 | 104 | 0.55 |
| Embodiment 6 | 108 | 0.58 |
| Embodiment 7 | 107 | 0.58 |
| Comparative Example 1 | 90 | 0.23 |

TABLE 3-continued

| Remark | An etching rate of a silicon nitride (Å/min) | Suppressing degree of regrowth of a silicon oxide (A regrowth starting depth of a silicon oxide/a depth of entire pattern) |
|---|---|---|
| Comparative Example 2 | 102 | 0.18 |

As shown in Table 3, when using the etching compositions according to embodiments of the present disclosure, the degree of suppression of regrowth of silicon oxide on the pattern increased by about 2 to 3 times compared to Comparative Embodiments 1 and 2. That is, when an additive containing an epoxy group, or a vinyl group, or both is added to a phosphoric acid solution, as in the etching composition according to the embodiments of the present disclosure, regrowth of the silicon oxide film may be significantly suppressed.

Figure 5:
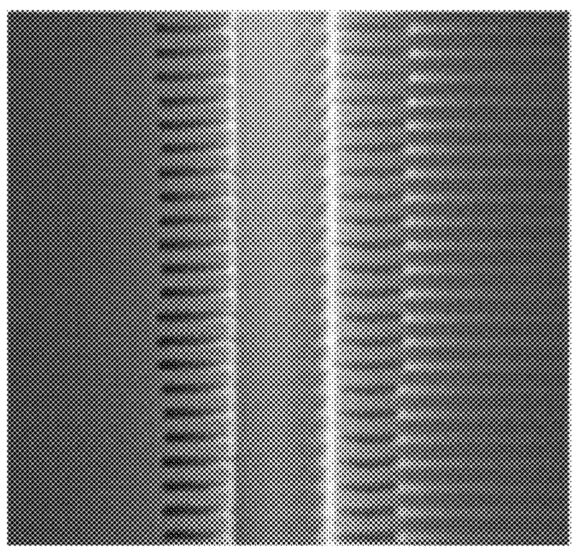
FIG. 5 is a photographic image of a field emission scanning electron microscope (FE-SEM) showing a result obtained when an etching process on a wafer including a stacked structure is performed by using an etching composition according to Comparative Example 1.

FIG. 5 is a photographic image of a field emission scanning electron microscope (FE-SEM) showing a result obtained when an etching process on a wafer including a stacked structure is performed by using an etching composition according to Comparative Example 1.

Figure 6:
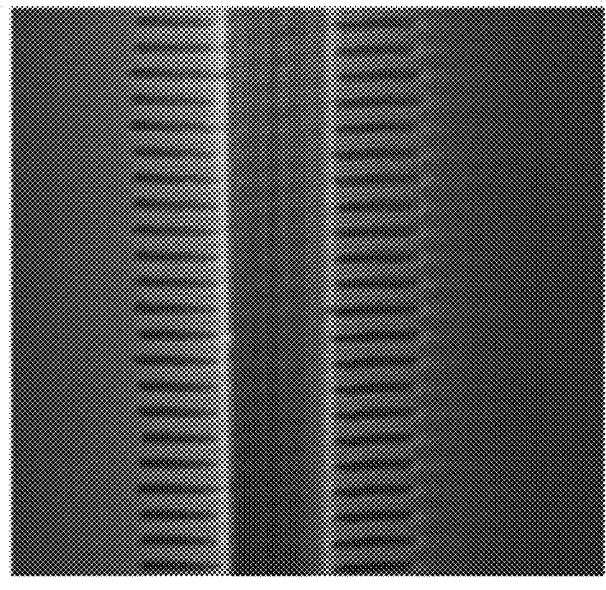
FIG. 6 is a FE-SEM photographic image showing a result obtained by performing an etching process on a wafer including a stacked structure using an etching composition according to Comparative Example 2.

FIG. 6 is a FE-SEM photographic image showing a result obtained by performing an etching process on a wafer including a stacked structure using an etching composition according to Comparative Example 2.

Figure 7:
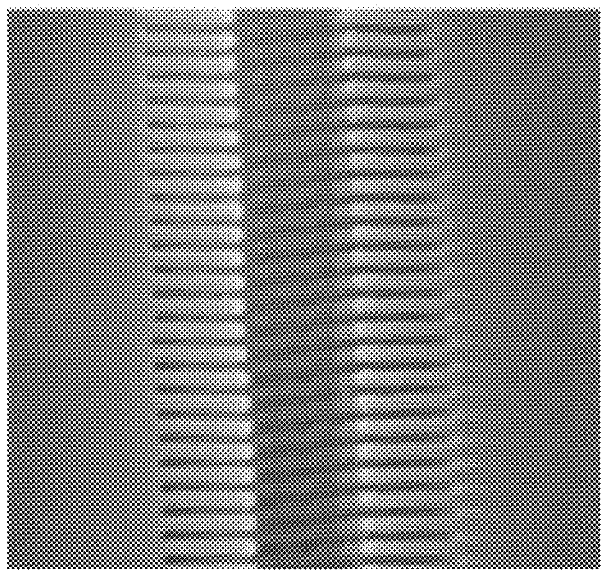
FIG. 7 is a FE-SEM photographic image showing a result obtained by performing an etching process on a wafer including a stacked structure using an etching composition according to Embodiment 5 of the present disclosure.

FIG. 7 is a FE-SEM photographic image showing a result obtained by performing an etching process on a wafer including a stacked structure using an etching composition according to Embodiment 5 of the present disclosure.

The results of FIGS. 5 to 7 may correspond to the results summarized in Table 3.

According to the embodiments of the present disclosure described above, an etching composition capable of increasing an etching selectivity a of silicon nitride compared to a silicon oxide and a polycrystalline silicon may be implemented. In particular, it is possible to implement an etching composition capable of increasing an etching selectivity of a silicon nitride with respect to both of a silicon oxide and a polycrystalline silicon in a structure in which the silicon oxide, the polycrystalline silicon, and the silicon nitride are simultaneously exposed, and also suppressing/preventing regrowth of silicon oxide generated by an etching by-product, etc. Therefore, the etching composition described above may be used as an etchant when selectively etching a silicon nitride in a structure in which silicon nitride and polycrystalline silicon are exposed, a structure in which silicon nitride and silicon oxide are exposed, or a structure in which silicon nitride, silicon oxide, and polycrystalline silicon are simultaneously exposed. In addition, since the above etching composition has a property to suppress the regrowth of a silicon oxide, when selectively etching a silicon nitride in a high tier stacked structure, for example, a stacked structure applied to the manufacture of a three-dimensional vertical NAND device, regrowth of silicon oxide may be effectively suppressed. Therefore, when using the etching composition according to embodiments of the present disclosure, a highly integrated/high-performance semiconductor device may be easily manufactured.

In the present specification, some embodiments have been disclosed, and although specific terms are used, these are only used in a general sense to easily describe the technological contents of various embodiments of the present disclosure and to help the understanding of these embodiments of the present disclosure, and are not used to limit the scope of embodiments of the present disclosure. It will be apparent to those of ordinary skill in the art that other modifications may be implemented in addition to the embodiments disclosed herein. It will be understood to those of ordinary skill in the art that an etching composition for selectively etching a silicon nitride, an etching method using the same, and a method for manufacturing a semiconductor device according to embodiments described with reference to FIGS. 1 to 7 may be variously substituted, changed and modified. Therefore, the scope of the invention should be determined by the technological concepts described in the claims.

[Explanation of Symbols]
* Explanation of symbols for the main parts of the drawing *

| | |
|---|---|
| 10: inorganic acid | 20: solvent |
| 30: additive | 100: etching composition |
| 110: substrate | 120: silicon nitride film |
| 130: silicon oxide film | 140: polycrystalline silicon member |
| 150: dielectric layer | 160: gate electrode |
| H1: hole | T1: opening |

What is claimed is:

1. An etching composition capable of increasing an etching selectivity for a silicon nitride over a silicon oxide and a polycrystalline silicon, the etching composition comprising:

an inorganic acid;

a solvent; and an additive, wherein the additive includes one or both of a compound containing an epoxy group and a compound containing a vinyl group, and the additive is a non-silicon-based additive, wherein the compound containing the epoxy group includes one or more of allyl glycidyl ether, epichlorohydrin, 1,2-epoxy-3-phenoxypropane, and 2,3-epoxypropyl benzene, and the compound containing the vinyl group includes one or both of vinyl bromide and phenyl vinyl ether, and wherein the etching composition has an etching selectivity of 50 or more for the silicon nitride compared to the polycrystalline silicon and an etching selectivity of 30 or more for the silicon nitride compared to the silicon oxide.

2. The etching composition of claim 1, wherein the inorganic acid is any one selected from the group consisting of phosphoric acid, sulfuric acid, nitric acid, silicic acid, hydrofluoric acid, boric acid, hydrochloric acid, perchloric acid, and a mixture thereof.

3. The etching composition of claim 2, wherein the inorganic acid is phosphoric acid.

4. The etching composition of claim 1, wherein a content of the inorganic acid in a total amount of the inorganic acid and the solvent is in a range of about 80 to about 90 wt %.

5. The etching composition of claim 1, wherein the solvent includes water ($H_2O$).

6. The etching composition of claim 1, wherein a content of the additive in the etching composition is in a range of about 0.001 to about 20 wt %.

7. The etching composition of claim 6, wherein the content of the additive in the etching composition is in a range of about 0.1 to about 3 wt %.

8. An etching method, comprising:

providing a substrate structure on which a silicon nitride and one or both of a silicon oxide and a polycrystalline silicon are disposed; and selectively etching the silicon nitride with respect to one or both of the silicon oxide and the polycrystalline silicon by applying the etching composition according to claim 1 to the substrate structure.

9. The etching method of claim 8, wherein selectively etching the silicon nitride is performed at a temperature in a range of about 100 to about 200° C.

10. A manufacturing method of a semiconductor device, comprising:

providing a substrate structure on which a silicon nitride and one or both of a silicon oxide and a polycrystalline silicon are disposed; and selectively etching the silicon nitride with respect to one or both of the silicon oxide and the polycrystalline silicon by applying the etching composition according to claim 1 to the substrate structure.

11. The manufacturing method of claim 10, wherein the semiconductor device is a vertical NAND device.

12. The manufacturing method of claim 11, wherein providing the substrate structure comprises:

forming a stacked structure in which a plurality of silicon nitride films and a plurality of silicon oxide films are alternately stacked in a specific direction on a substrate; and forming a polycrystalline silicon member extending in the specific direction within the stacked structure, and wherein selectively etching the silicon nitride comprises selectively etching the silicon nitride film with respect to the silicon oxide film and the polycrystalline silicon member by using the etching composition.

* * * * *